United States Patent
Szeremeta

(10) Patent No.: US 9,443,560 B2
(45) Date of Patent: Sep. 13, 2016

(54) SERVER WITH STORAGE DRIVE COOLING SYSTEM

(71) Applicant: Western Digital Technologies, Inc., Irvine, CA (US)

(72) Inventor: Wojciech Szeremeta, Mission Viejo, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 112 days.

(21) Appl. No.: 14/531,537

(22) Filed: Nov. 3, 2014

(65) Prior Publication Data

US 2016/0128237 A1    May 5, 2016

(51) Int. Cl.
| | |
|---|---|
| *H05K 7/20* | (2006.01) |
| *G06F 1/20* | (2006.01) |
| *G11B 33/14* | (2006.01) |
| *H05K 7/14* | (2006.01) |
| *G11B 33/12* | (2006.01) |
| *G06F 1/18* | (2006.01) |

(52) U.S. Cl.
CPC .............. *G11B 33/142* (2013.01); *G06F 1/187* (2013.01); *G11B 33/128* (2013.01); *H05K 7/1488* (2013.01); *H05K 7/20145* (2013.01); *H05K 7/20181* (2013.01); *H05K 7/20727* (2013.01)

(58) Field of Classification Search
CPC .......................... G11B 33/127–33/128; G11B 33/1406–33/144; H05K 7/20554–7/581; H05K 7/20727–7/20736
See application file for complete search history.

(56) References Cited

U.S. PATENT DOCUMENTS

| | | | |
|---|---|---|---|
| 6,480,380 B1 | 11/2002 | French et al. | |
| 6,618,248 B1 | 9/2003 | Dalheimer | |
| 6,621,693 B1* | 9/2003 | Potter | G06F 1/184 257/E23.099 |
| 6,754,082 B1* | 6/2004 | Ding | G11B 33/02 312/223.1 |
| 7,495,906 B2* | 2/2009 | Fujie | G11B 33/12 361/679.33 |
| 7,701,705 B1 | 4/2010 | Szeremeta | |
| 8,064,194 B2 | 11/2011 | Szeremeta | |
| 8,113,873 B1 | 2/2012 | Sarraf | |
| 8,133,426 B1 | 3/2012 | Yurchenco et al. | |
| 8,358,395 B1 | 1/2013 | Szeremeta | |
| 8,417,979 B2 | 4/2013 | Maroney | |
| 8,451,600 B1* | 5/2013 | Ross | H05K 7/20545 165/80.3 |

(Continued)

FOREIGN PATENT DOCUMENTS

JP      2003323789    11/2003

OTHER PUBLICATIONS

International Search Report and Written Opinion dated Jan. 28, 2016 from PCT Serial No. PCT/US2015/056573, 13 pages.

(Continued)

*Primary Examiner* — Robert J Hoffberg
(74) *Attorney, Agent, or Firm* — Knobbe, Martens, Olson & Bear, LLP

(57) ABSTRACT

A server chassis can provide air flow to the top and bottom of multiple storage drives. The server chassis can include an enclosure having a top wall and a bottom wall, and a base plate positioned between the top and bottom walls of the enclosure. The base plate can include a plurality of storage drive receiving areas, a plurality of recesses, and a plurality of openings. Each recess can be positioned at a corresponding one of the storage drive receiving areas and be configured to be under a storage drive received at the storage drive receiving area. Each opening can be used to direct air flow from below the base plate into the recesses and thereby onto a bottom of the storage drives.

21 Claims, 9 Drawing Sheets

(56) References Cited

U.S. PATENT DOCUMENTS

| | | |
|---|---|---|
| 8,462,460 B1 | 6/2013 | Szeremeta et al. |
| 8,498,088 B1 | 7/2013 | Klein |
| 8,547,658 B1 | 10/2013 | Szeremeta |
| 9,060,425 B2 * | 6/2015 | Yin ...................... H05K 5/0221 |
| 2004/0172642 A1 * | 9/2004 | Ding .................... G11B 33/142 |
| | | 720/649 |
| 2005/0162831 A1 | 7/2005 | Shum et al. |
| 2010/0073868 A1 * | 3/2010 | Mayer ................ H05K 7/20736 |
| | | 361/679.51 |
| 2011/0292602 A1 | 12/2011 | Narasimhan et al. |
| 2013/0088823 A1 | 4/2013 | Yang |
| 2013/0210334 A1 | 8/2013 | Tan |
| 2015/0192970 A1 * | 7/2015 | Jau .......................... G06F 1/187 |
| | | 361/679.33 |

OTHER PUBLICATIONS

"Business Storage 8-bay Rackmount NAS," Technology paper, www.Seagate.com, Jan. 1, 2014, pp. 1-3.

* cited by examiner

SERVER WITH STORAGE DRIVE COOLING SYSTEM

BACKGROUND

Rack mountable servers are generally shaped and sized based on industry standards. For example, a standard server-rack configuration, one rack unit or 1 U is 19 inches (480 mm) wide and 1.75 inches (44 mm) tall. The most common computer rack form-factor is 42 U high, which can receive up to 42 discrete computer devices that are directly mountable in the rack.

To maximize storage capacity of certain servers, rack mountable or otherwise, disk drives are tightly packed side by side within an enclosure. A 1 U server hosting either eight (8λ) or twelve (12λ) disk drives is an example of a densely packed storage server. Such a server has very little space for air movement between each disk drive. Thus, it will be understood that placing a large number of disk drives close together can introduce cooling issues.

BRIEF DESCRIPTION OF THE DRAWINGS

Various embodiments are depicted in the accompanying drawings for illustrative purposes, and should in no way be interpreted as limiting the scope of the inventions.

DETAILED DESCRIPTION

To maximize storage capacity of certain servers, storage drives are tightly packed side by side within an enclosure. Placing a large number of storage drives close together can introduce cooling issues. Many servers utilize force convention cooling systems to remove the heat from disk drives and controlling electronics. Such cooling systems are designed to move a large volume of air across or throughout the server in order to remove the heat energy created by the operation of the server.

Effective air flow mass movement generally requires open spaces (low impedance) between and around storage drives and surrounding electronics throughout the server. At the same time, it is desirable to have size efficient enclosures where the volume and footprint of the enclosure are minimized as much as possible. In many cases, the necessity of open space limits the overall server storage density within a given volumetric space of the server.

Figure 1:
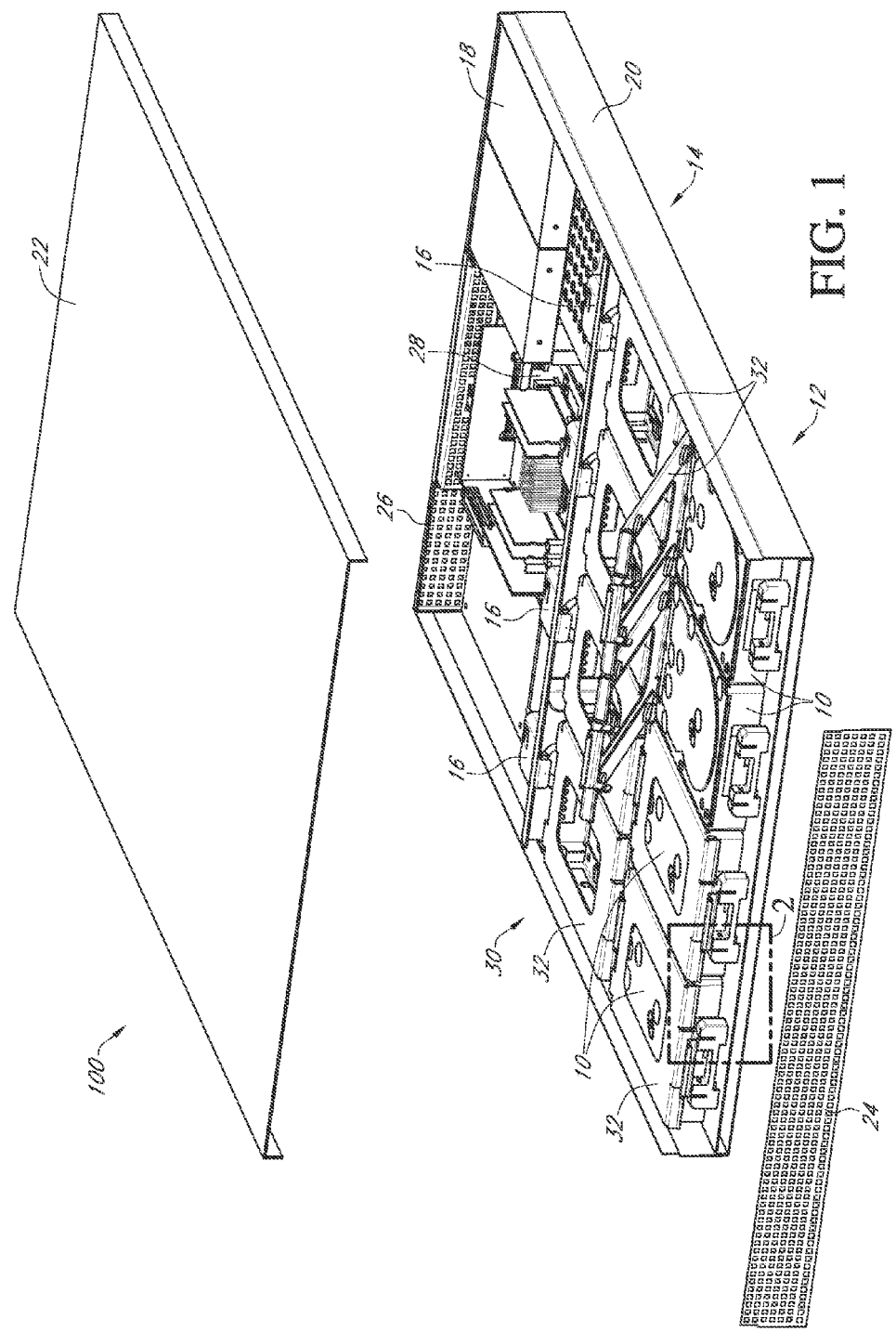
FIG. 1 shows a partially disassembled server including a server chassis with fans and a plurality of receiving areas for a plurality of hard drives.

A 1 U server hosting either eight (8×) or twelve (12×) disk drives is an example of a densely packed storage server having very little space for air movement between each storage drive. FIG. 1 illustrates a partially disassembled 1 U server 100 that can hold up to eight disk drives 10. These storage size efficient servers can create many design challenges to provide efficient cooling. A low cost and improved air flow management scheme is described below. The air flow management scheme can be used to provide air flow around each drive in a densely packed 1 U server chassis, as well as other styles of servers and computers. It can also be used for cooling within other types of electronics devices, to cool other types of electronic components, not limited to storage drives.

Figure 2:
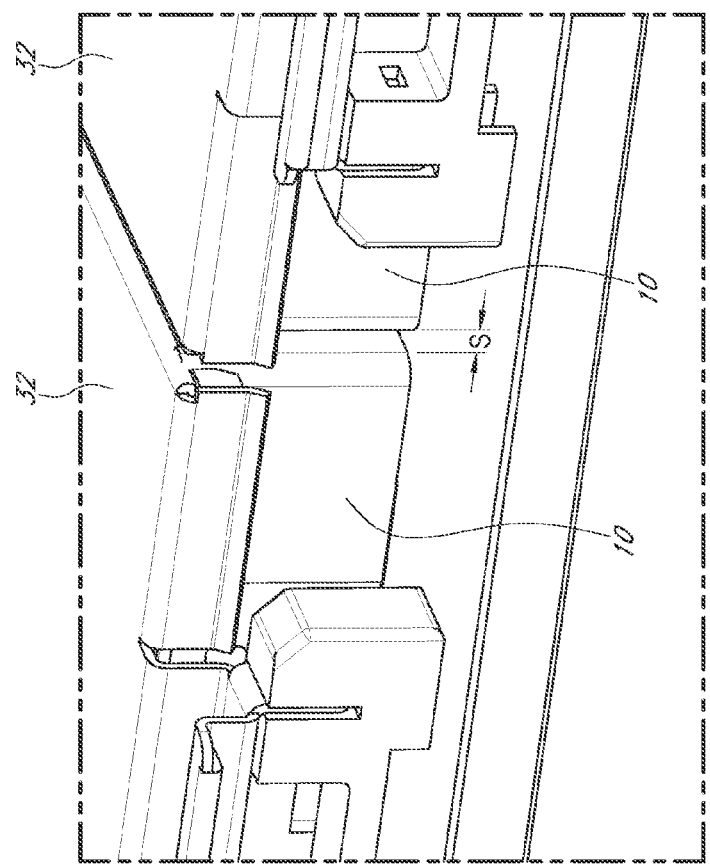
FIG. 2 is a detail view of the spacing between hard drives taken along line 2 of FIG. 1.
Figure 3:
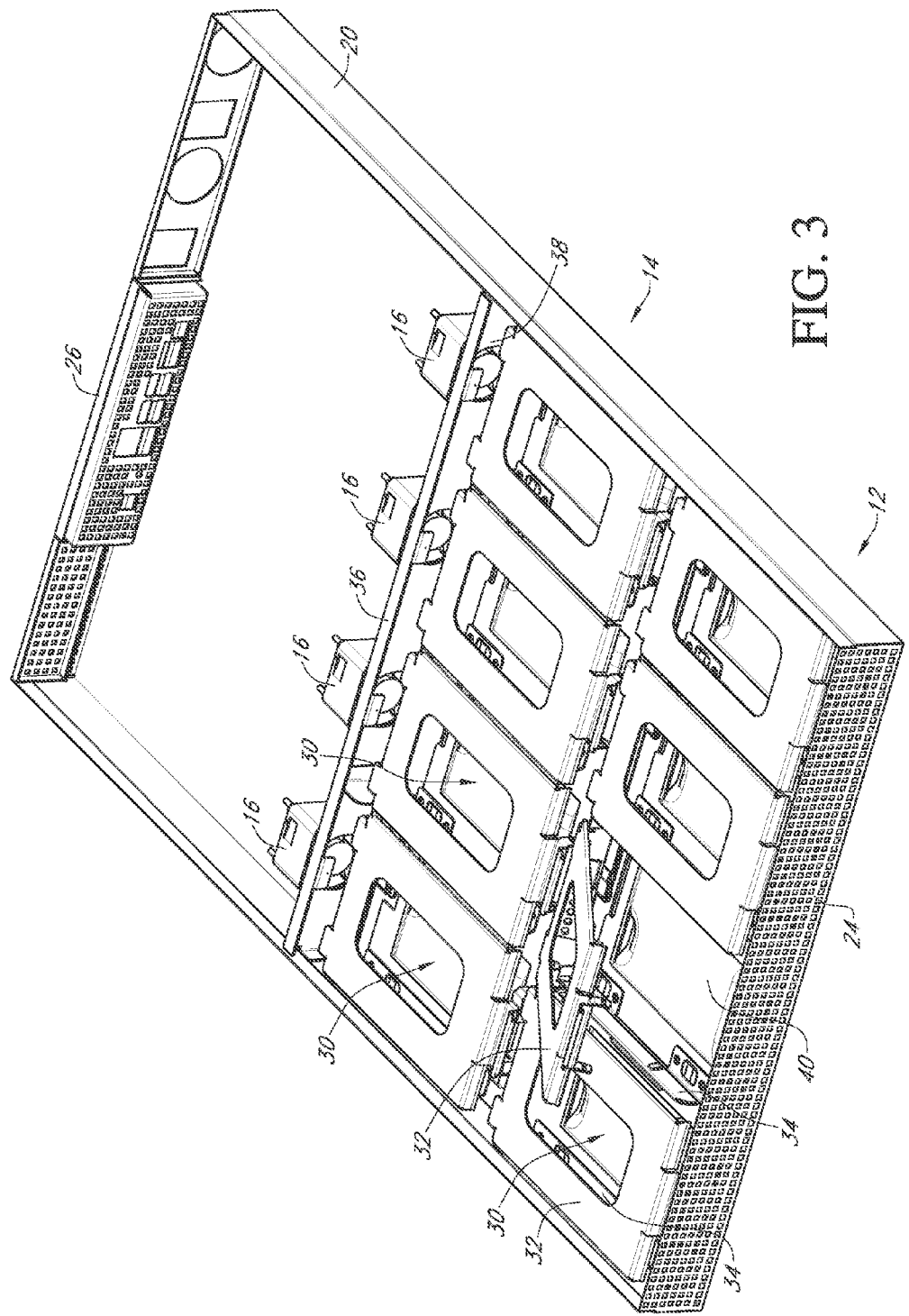
FIG. 3 shows a server chassis.

It can be very challenging to move air through a 1 U server having eight or more disk drives. This is due to a very small open spacing that is generally required between two adjacent disk drives. Efficient force convection cooling requires unrestricted air flow mass movement around heat dissipating devices in order to remove the heat energy. Looking to the detail view of FIG. 2, a small space "S" between adjacent disk drives 10 can be seen. In some servers this space may be only 2-3 mm, though other spacing or configurations may be provided.

As illustrated, there is very little space between two adjacent disk drives 10 for air movement. Since the spacing between the two adjacent disk drives is very small, there is a limited space for air flow. Thus, without additional spacing or other assistance, the convection cooling between the two drives would be restricted due to high air flow impedance.

Various components of the illustrated server 100 will now be described. A description of certain embodiments of air flow management that can be used in the illustrated server 100, as well as in other types of electronic devices, not limited to servers, computers, and data storage devices, will then be described.

Returning to FIG. 1, a server 100 is illustrated. The server 100 can be rack mountable (such as with additional hardware) or standalone. The server 100 can hold up to eight disk drives 10 organized in two rows (a front row 12 and a back row 14) and four columns. Other configurations can also be used where the disk drives do not need to be symmetrically organized or evenly spaced and positioned as is the illustrated embodiment.

The server 100 can include an enclosure, such as a bottom chassis 20, a top cover 22, a front grill 24, and rear grill 26. As shown, the front and rear grills include holes for ventilation. In other embodiments, any portion of the enclosure may have one or more holes for ventilation. In addition, the enclosure can have any number of different shapes and configurations. The server chassis 20 can include any number of different features, such as one or more storage drive 10, fan 16, power supply 18, printed circuit board 28 (CPU, I/O Board, memory modules), etc.

The server chassis 20 can include one or more storage drive receiving areas 30. As illustrated, the storage drive receiving areas 30 each receive a single storage drive 10 that is secured in place with a clamp down lid 32. The storage drive 10 can be a hard disk drive (HDD), a solid state drive (SSD), an optical storage device, etc. FIG. 1 shows four storage drives 10 in the front row 12, each positioned within one of the storage drive receiving areas 30. In the front row 12, it can be seen that two of the clamp down lids 32 are closed on the drives, and two lids are open. The storage drive receiving areas 30 can have one of any number of different designs, for example they can be hot swappable, snap-in, one button release, etc. In addition, in some embodiments a single lid or closure 32 can secure multiple storage drives 10 within the chassis 20.

Turning now to FIGS. 3-6, the storage drive receiving areas 30 can be seen in more detail. Each storage drive receiving area 30 can include a cradle 34 and a clamp 32. The cradle 34 can be used to properly and securely position the storage drive 10 within the storage drive receiving area 30. The clamp 32 can be used to lock the storage drive 10 in place in the server. It will be understood that any number of different styles of storage drive receiving area 30 can be used in place of one or more of the cradle 34 and the clamp 32.

Figure 4:
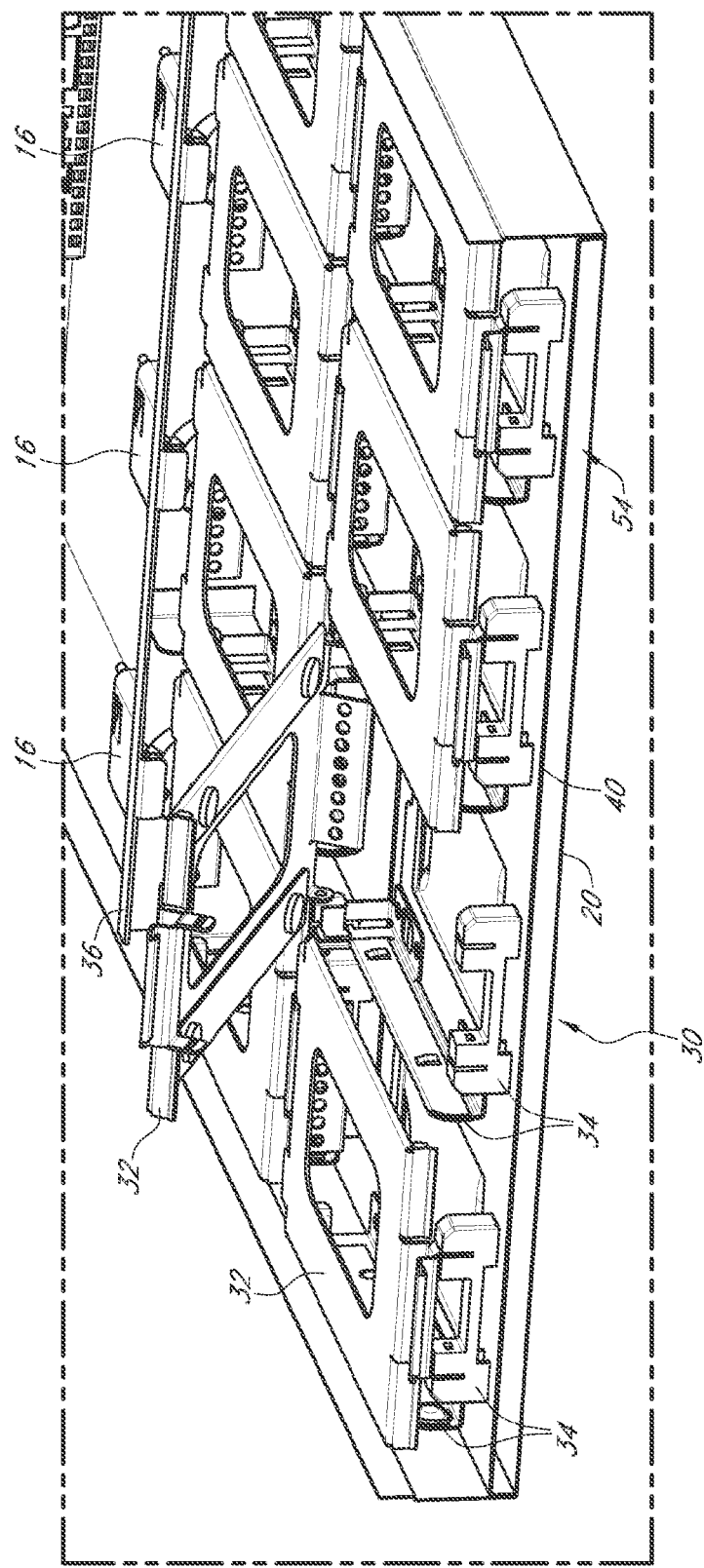
FIG. 4 illustrates a detail view of a storage drive receiving area of the server chassis.
Figure 5:
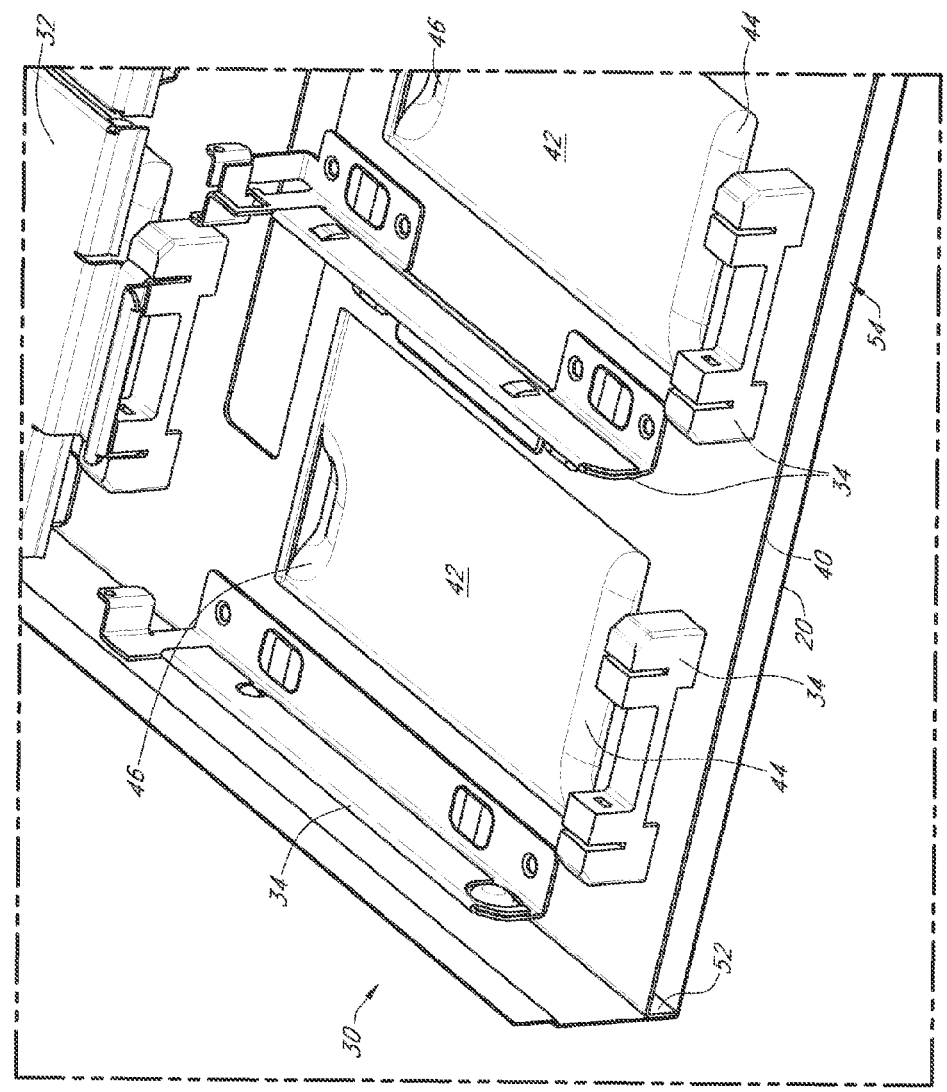
FIG. 5 illustrates a second detail view of the storage drive receiving area of the server chassis with the top clamps removed.

A base plate or mid-plate bracket assembly 40 can be used to form a bottom of one or more of the storage drive receiving areas 30. The base plate 40 can be positioned between the top and bottom of the enclosure and establish an air channel 54 between the base plate 40 and the bottom surface of the chassis 20 (FIGS. 4-5). For example, the base plate 40 can have two or more legs 52 that can be placed adjacent the bottom surface of the chassis 20 and position the rest of the base plate above the bottom surface. It will be understood that the base plate can also connect to the chassis in other ways to create an air channel 54.

In some embodiments, the server chassis can be size efficient per the type of storage drive. Thus, even with the air channel 54, a height of the server chassis defined by the distance from the top wall to the bottom wall of the enclosure can be less than two times a height of a storage drive to be received within the enclosure. In other embodiments, it can be less than 1.5, 1.6, 1.7, 1.8, or 1.9 times. Put another way, the height of the storage drive can be 40%, 50%, 60%, 70%, 80%, or 90% of the height of the enclosure. In some embodiments, the height of the storage drive can be between 40% and 80%, 50% and 70%, 55% and 65% of the height of the enclosure.

Figure 6:
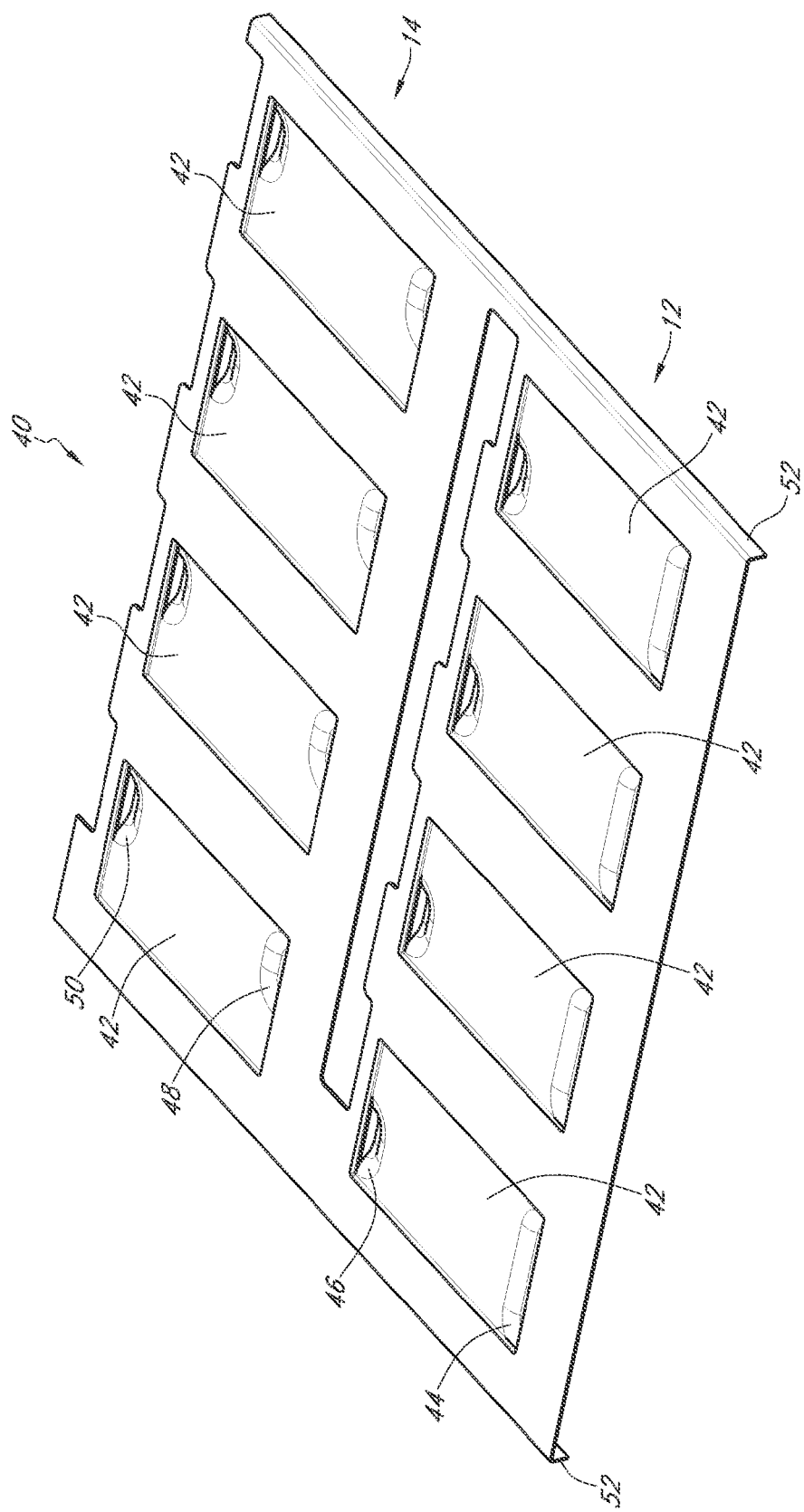
FIG. 6 shows a base plate of the server chassis.

Looking now to FIGS. 5-6, it can be seen that the base plate 40 has a recess 42 positioned at each of the storage drive receiving areas 30. The recess 42 can be an embossed feature formed into the base plate 40, or can be created in other ways. The recess 42 can create an air passageway to allow a flow of air to access the bottom of a storage drive 10. Channeling air directly to the bottom of the storage drive 10 can increase cooling in an efficient matter.

According to some embodiments, the recess 42 can have a footprint on the base plate 40 smaller than a footprint of the storage drive 10 on the base plate 40. This can help ensure proper air flow through the recess when a storage drive is positioned at the storage drive receiving area 30. In some embodiments, the storage drive 10 can close or prevent access to the recess from a top of the base plate 40. In some embodiments, the storage drive can effectively seal off access to the top of the recess. In other embodiments, air can flow into and out of the recess from both the top and bottom of the base plate 40. Though, it will be understood that preferably, the primary air flow into and out of the recess comes from under the base plate 40 as discussed below.

Each recess 42 can have one or more opening into the recess. The opening can provide access to the air channel 54. For example, the recess can have a first opening 46, 50 and a second opening 44, 48 on an opposite side of the recess to facilitate flow through the recess. In some embodiments, the openings can comprise louvers 44, 46, 50, 48. The louvers can be shaped and positioned to maximize air flow into the recess while reducing turbulence, resistance, and/or obstructions to air flow among other benefits. In some embodiments, one or more of the louvers extend to the bottom surface of the chassis 20.

In some embodiments, one louver can be larger than other louvers. For example, in the illustrated embodiment the louver 44 at the front of the storage drive receiving area 30 in the first row 12 is larger than the louver 46 at the back of the storage drive receiving area. In addition, the louver 44 is larger than both louvers 48, 50 in the storage drive receiving area 30 of the second row 14. In some embodiments, each of the storage drive receiving areas of the first row 12 has a larger louver 44 at the front of the storage drive receiving area 30 than in the back 46 of the storage drive receiving area 30. In some embodiments, each of the storage drive receiving areas 30 of the second row 14 can have same sized louvers at the front 48 of the storage drive receiving area as at the back 50 of the storage drive receiving area. In some embodiments, one or more of the louvers can be offset from other louvers in a column of storage drive receiving areas. For example, one or more louver in one row can be offset from one or more louver in a different row. In still another example, the louvers of one storage drive receiving area can be aligned while being offset from one or more louver of another storage drive receiving area in the column.

In some embodiments, the server can include a plurality of storage drive receiving areas 30, each with embossed features 42. Each embossed feature 42 can be positioned below each storage drive receiving area 30 and can be configured to form an air space below each storage drive for cooling. In some embodiments, each embossed feature can comprise two louvers, one at a front and one at a back of each storage drive receiving area. The two louvers can be configured to direct air flow from an air channel below the base plate into the embossed feature below each storage drive and then out of the embossed feature.

Figure 7:
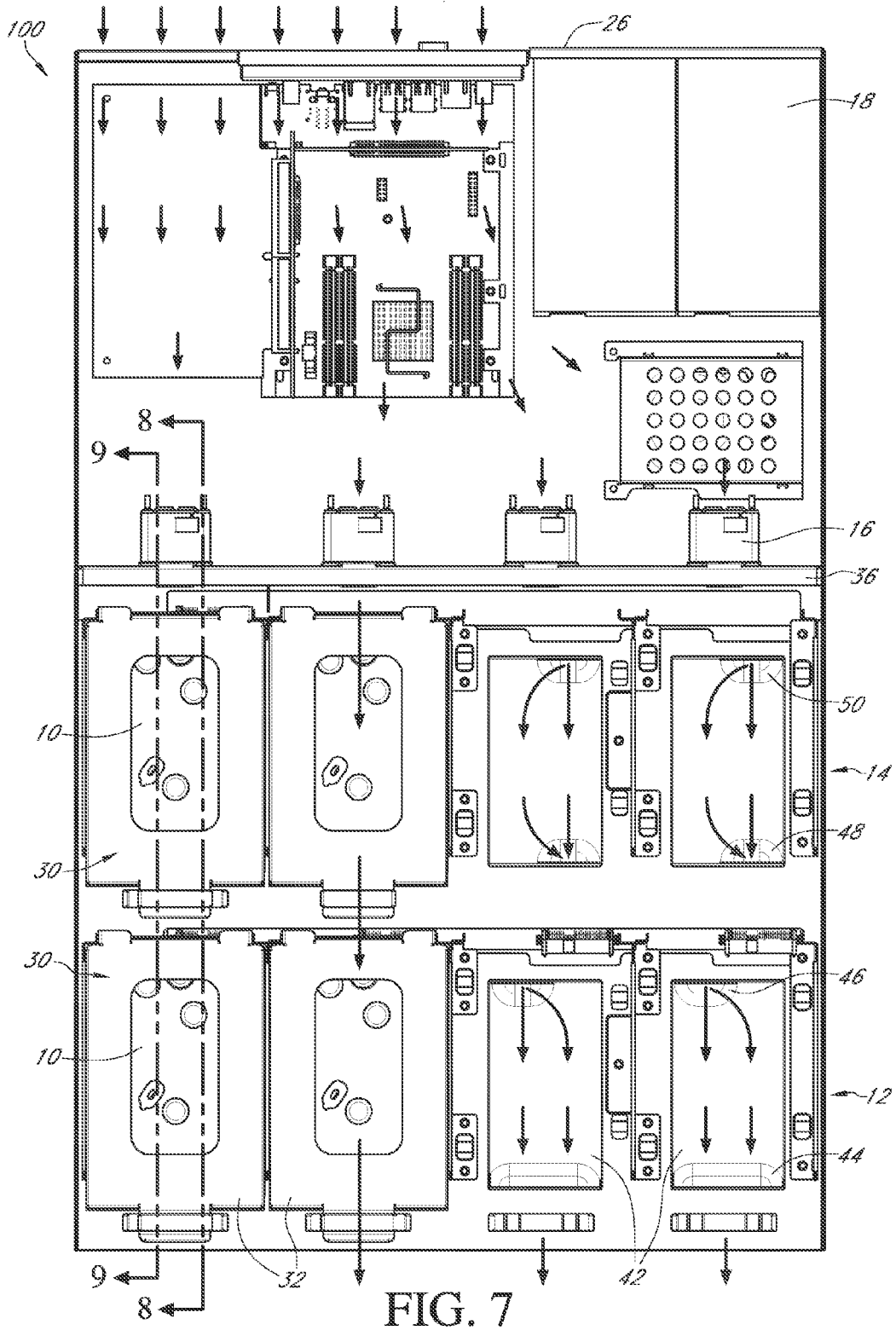
FIG. 7 is a schematic representation of air flow through the server as viewed from the top.

Returning to FIG. 3, but also with reference to FIG. 7, a fan 16 is shown aligned with each column of storage drive receiving areas 30. In some embodiments, the server can include one fan or multiple fans. A fan can service one or more storage drive receiving area and/or storage drive. For example, in some embodiments, 1, 2, 3, 4, 5, or more fans 16 can service all eight of the illustrated storage drive receiving areas 30. In addition, the fan(s) may also serve other components such as a power supply 18 and/or a PCB 28.

As illustrated, a bank of fans 16 can be used to cool the storage drives. A bracket 36 with one or more openings 38 or other structure can be used to direct air flow from the fans 16 to the storage drive receiving areas 30, or from the storage drive receiving areas 30 to the fans, depending on the direction of air flow. As illustrated, a fan 16 is positioned at the opening 38. The bracket 36 can prevent air flow from passing the bracket within the server enclosure, except through the openings 38. According to some embodiments, every opening 38 in the bracket 36 has an associated fan 16.

In some embodiments, a plurality of fans 16 can be positioned between the top and bottom walls of the server enclosure. The fans 16 can be positioned adjacent an end of the base plate 40 to direct air above and below the base plate.

As has been mentioned, two rows of storage drive receiving areas 30 are shown, a front row 12 and a back row 14. The two rows are organized into four columns, each column including one storage drive receiving area 30 from each of the two rows 12, 14. The fans 16 can be aligned with the rows and/or columns of storage drive receiving areas 30. For example, each fan 16 of each column can be centered with the adjacent most storage drive receiving area in the second row 14 as shown in FIG. 7. In other embodiments, each fan can be aligned with the back louver 50 of the adjacent most storage drive receiving area in the second row 14.

Figure 8:
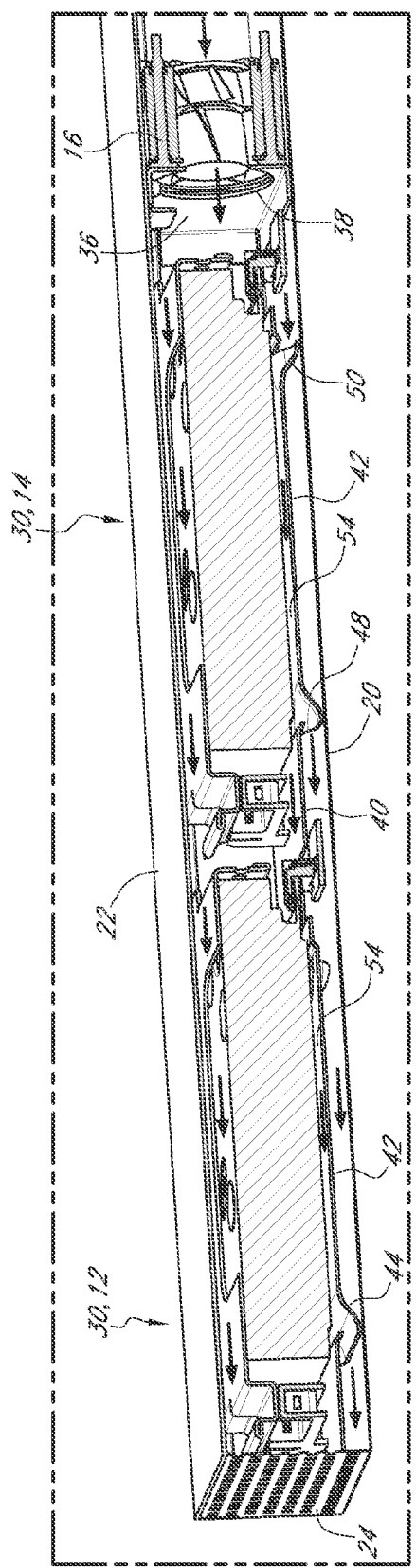
FIG. 8 is a cross-sectional view of the server taken along line 8-8 of FIG. 7.
Figure 9:
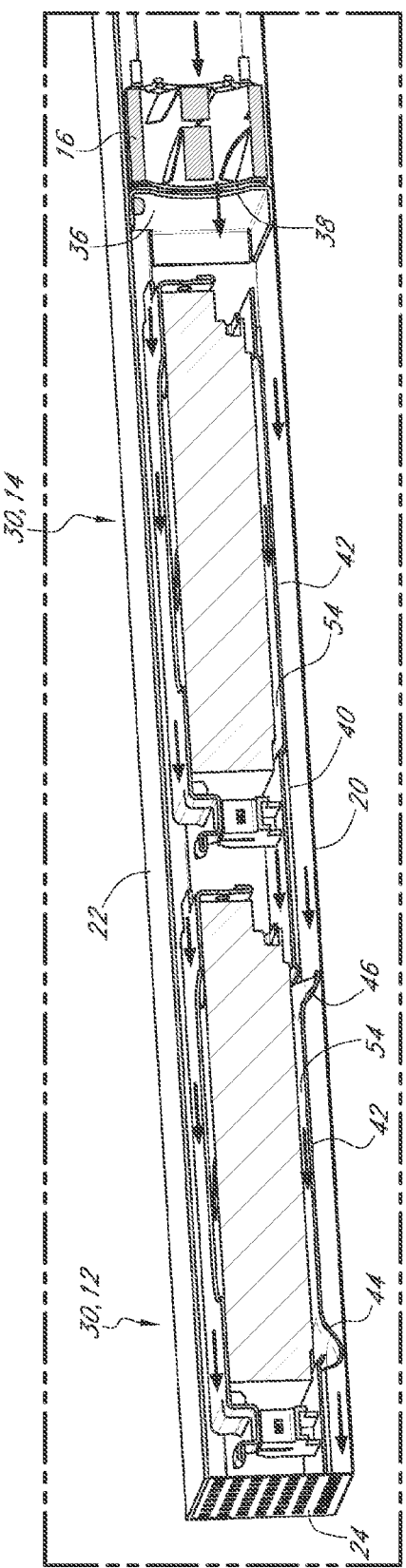
FIG. 9 is a cross-sectional view of the server taken along line 9-9 of FIG. 7.

Looking now to FIGS. 7-9, air flow cooling paths (represented by arrows) within the server 100 are shown. In FIG.

7, air flow is shown flowing from the back grill 26 to the bank of fans 16. As illustrated, the fans 16 then direct air over the storage drives 10 and/or storage drive receiving areas 30. Air can flow both above and below each storage drive 10. The storage drive receiving areas 30 on the bottom left of the figure are shown with storage drives 10. Thus, the air flow above the storage drives 10 and the storage drive receiving areas 30 can be seen. The storage drive receiving areas 30 on the bottom right of the figure are shown without storage drives. The clamps 32 have also been removed to better illustrate the recesses 42 and the louvers 44, 46, 48, 50. Thus, air flow below the storage drives 10 and within the recesses can be seen on the bottom right.

Air flow above and below the storage drives 10 and storage drive receiving areas 30 can also be seen in the cross-sectional views of FIGS. 8-9. Air flow from the fan 16 can be seen to flow below the storage drives 10 and storage drive receiving areas 30 within the channel 54. Air flow can also be seen to flow into the recess 42 in the second row 14 through the louver 50 (FIG. 8). Air can then flow through the space between the recess and the bottom of the storage drive 10 until it leaves through the louver 48. Air can also flow under the recess 42 or to the side of the recess. Air can also flow into the recess 42 in the first row 12 through the louver 46 (FIG. 9). Air can then flow through the space between the recess and the bottom of the storage drive 10 until it leaves through the louver 44.

Air flow from the fan 16 can also be seen to flow above the storage drives 10 and storage drive receiving areas 30. It will be understood that the holes in the clamps 32 can allow heat to rise from the storage drives 10 to be more easily carried away by the air flow above the storage drives 10. This also allows the air to cool the storage drives through convection (both above and below).

The illustrated server can beneficially have a 1 U server design with optimized free spacing below and above each storage drive to enable effective air flow movement. The chassis design as shown incorporates a mid-plate bracket assembly having embossed features below each drive forming sufficiently large air spaces for effective cooling. In addition, the embossed feature has integrated two louver features at the front and back of each drive directing air flow path below each drive. These concepts can also be applied to other configurations of servers, among other electronic equipment.

According to some embodiments, a chassis for housing a plurality of storage drives can have an optimized free spacing below and above each storage drive (such as a disk drive) to enable effective air flow movement. The chassis can comprise a mid-plate bracket assembly having embossed features below each disk drive forming sufficiently large air spaces below each drive for cooling.

In some embodiments, a server chassis can be provided for housing a plurality of storage drives having open space below and above each storage drive to enable effective air flow movement through the server chassis. The server chassis can comprise an enclosure having a top wall and a bottom wall, and a mid-plate bracket assembly positioned between the top and bottom walls of the enclosure. The relationship of the mid-plate bracket assembly and the bottom wall can define an air channel therebetween. The mid-plate bracket assembly can comprise a plurality of storage drive receiving areas and a plurality of recesses. Each recess of the plurality can be positioned at a corresponding storage drive receiving area to form an air space below each storage drive for cooling. Each recess of the plurality can comprise first and second openings. The first opening can be configured to direct air flow from the air channel below the mid-plate bracket assembly into the recess below each storage drive and the second opening can be configured to direct air flow out of the recess. A plurality of fans can also be provided. The fans can be positioned between the top and bottom walls of the enclosure and adjacent an end of the mid-plate bracket assembly. The fans can be configured to direct air above the mid-plate bracket assembly and below the mid-plate bracket assembly within the air channel and thereby into the first opening.

In some embodiments, a server chassis can provide air flow to a top and a bottom of a storage drive. The server chassis can comprise an enclosure having a top wall and a bottom wall and a base plate positioned between the top and bottom walls of the enclosure and defining one or more air channels. The base plate can have a top surface and a bottom surface. The base plate can comprise a plurality of storage drive receiving areas on the top surface, each storage drive receiving area comprising an electrical connector configured to electrically connect to a storage drive. A plurality of recesses can be formed in the top surface, each recess of the plurality positioned at a corresponding one of the storage drive receiving areas and configured to be under a storage drive received at the storage drive receiving area. A first louver can be configured to direct air flow from below the base plate into the recess. A second louver can be configured to direct air flow from the recess to below the base plate.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above.

What is claimed is:

1. A server chassis for housing a plurality of storage drives and having open space below and above each of the storage drives to enable effective air flow movement through the server chassis, the server chassis comprising:
    an enclosure having a top wall and a bottom wall;
    a mid-plate bracket assembly positioned between the top and bottom walls of the enclosure, a relationship of the mid-plate bracket assembly and the bottom wall defining an air channel therebetween, the mid-plate bracket assembly comprising:
        a plurality of storage drive receiving areas; and
        a plurality of embossed features, each embossed feature of the plurality of embossed features positioned below each of the storage drive receiving areas and configured to form an air space below each of the storage drives for cooling, each embossed feature of the plurality of embossed features comprising two louvers, one at a front and one at a back of each of the storage drive receiving areas, the two louvers configured to direct air flow from the air channel below the mid-plate bracket assembly into the embossed feature below each of the storage drives and then out of the embossed feature; and a plurality of fans, each fan of the plurality of fans positioned between the top and bottom walls of the enclosure and adjacent an end of the mid-plate bracket assembly and configured to direct air above the mid-plate bracket assembly and below the mid-plate bracket assembly within the air channel.

2. The server chassis of claim 1, wherein for at least some of the storage drive receiving areas, the louver at the front of the at least some of the storage drive receiving area is larger than the louver at the back of the at least some of the storage drive receiving areas.

3. The server chassis of claim 1, wherein the plurality of storage drive receiving areas comprises a first row of at least two of the storage drive receiving areas and a second row of at least two of the storage drive receiving areas.

4. The server chassis of claim 3, wherein each of the storage drive receiving areas of the first row has a larger louver at the front thereof than in the back thereof.

5. The server chassis of claim 4, wherein each of the storage drive receiving areas of the second row has same sized louvers at the front thereof as at the back thereof.

6. The server chassis of claim 3, wherein the first row of the at least two of the storage drive receiving areas and the second row of the at least two of the storage drive receiving areas are positioned such that the storage drive receiving areas are aligned in columns and the plurality of fans comprises one fan aligned with each of the columns of the storage drive receiving areas.

7. The server chassis of claim 6, wherein the one fan of each of the columns is centered with an adjacent most of the storage drive receiving areas in the second row.

8. The server chassis of claim 7, wherein the back louvers of the storage drive receiving areas in the second row are offset from the back louvers of the first row.

9. The server chassis of claim 1, wherein one or more of the louvers extend to the bottom wall.

10. The server chassis of claim 1, wherein the mid-plate bracket assembly further comprises first and second legs in contact with the bottom wall of the enclosure.

11. The server chassis of claim 1, wherein a height of the server chassis defined by a distance from the top wall to the bottom wall of the enclosure is less than two times a height of a respective one of the storage drives to be received within the enclosure.

12. The server chassis of claim 1, wherein a footprint on the mid-plate bracket assembly of each embossed feature is smaller than a footprint on the mid-plate bracket assembly of each of the storage drives to be received at a respective one of the storage drive receiving areas.

13. The server chassis of claim 1, wherein each storage drive receiving area of the plurality of storage drive receiving areas comprises a cradle and a clamp.

14. A rack mountable server comprising the server chassis of claim 1, a plurality of storage drives, and a power supply, each storage drive of the plurality of storage drives positioned at a respective one of the plurality of storage drive receiving areas.

15. A server chassis for housing a plurality of storage drives and having open space below and above each of the storage drives to enable effective air flow movement through the server chassis, the server chassis comprising:

an enclosure having a top wall and a bottom wall;

a mid-plate bracket assembly positioned between the top and bottom walls of the enclosure, a relationship of the mid-plate bracket assembly and the bottom wall defining an air channel therebetween, the mid-plate bracket assembly comprising:

a plurality of storage drive receiving areas; and a plurality of recesses, each recess of the plurality of recesses positioned at a corresponding one of the storage drive receiving areas to form an air space below each of the storage drives for cooling, each recess of the plurality of recesses comprising first and second openings, the first opening configured to direct air flow from the air channel below the mid-plate bracket assembly into the recess below each of the storage drives and the second opening configured to direct air flow out of the recess; and a plurality of fans, each fan of the plurality of fans positioned between the top and bottom walls of the enclosure and adjacent an end of the mid-plate bracket assembly and configured to direct air above the mid-plate bracket assembly and below the mid-plate bracket assembly within the air channel and thereby into the first opening.

16. The server chassis of claim 15, wherein the first and second openings comprise respective first and second louvers.

17. The server chassis of claim 15, wherein the plurality of storage drive receiving areas comprises a first row of at least two of the storage drive receiving areas and a second row of at least two of the storage drive receiving areas.

18. The server chassis of claim 17, wherein the first row of the at least two of the storage drive receiving areas and the second row of the at least two of the storage drive receiving areas are positioned such that the storage drive receiving areas are aligned in columns and the plurality of fans comprises one fan aligned with each of the columns of the storage drive receiving areas.

19. The server chassis of claim 15, wherein each storage drive receiving area of the plurality of storage drive receiving areas comprises a cradle and a clamp.

20. A rack mountable server comprising the server chassis of claim 15, a plurality of storage drives, and a power supply, each storage drive of the plurality of storage drives positioned at a respective one of the plurality of storage drive receiving areas.

21. A server chassis to provide an air flow to a top and a bottom of a storage drive, the server chassis comprising:

an enclosure having a top wall and a bottom wall; and a base plate positioned between the top and bottom walls of the enclosure and defining one or more air channels, the base plate having a top surface and a bottom surface and comprising:

a plurality of storage drive receiving areas on the top surface, each of the storage drive receiving areas comprising an electrical connector configured to electrically connect to a respective storage drive;

a plurality of recesses in the top surface, each recess of the plurality of recesses positioned at a corresponding one of the storage drive receiving areas and configured to be under the storage drive received at the corresponding one of the storage drive receiving areas;

a first louver configured to direct a portion of the air flow from below the base plate into a respective one of the recesses; and a second louver configured to direct the portion of the air flow from the respective one of the recesses to below the base plate.

\* \* \* \* \*

UNITED STATES PATENT AND TRADEMARK OFFICE
CERTIFICATE OF CORRECTION

| | |
|---|---|
| PATENT NO. | : 9,443,560 B2 |
| APPLICATION NO. | : 14/531537 |
| DATED | : September 13, 2016 |
| INVENTOR(S) | : Wojciech Szeremeta |

Page 1 of 1

It is certified that error appears in the above-identified patent and that said Letters Patent is hereby corrected as shown below:

In the Specification

Column 1 Line 16, Change "(8λ)" to --(8X)--.

Column 1 Line 16, Change "(12λ)" to --(12X)--.

In the Claims

Column 8 Line 61, Claim 21, after "respective" insert --one of the--.

Column 8 Line 61, Claim 21, change "drive;" to --drives;--.

Signed and Sealed this
Twenty-eighth Day of August, 2018

Andrei Iancu
*Director of the United States Patent and Trademark Office*